(12) United States Patent
Ali et al.

(10) Patent No.: US 8,358,228 B2
(45) Date of Patent: Jan. 22, 2013

(54) METHOD FOR MODIFYING THE LMS ALGORITHM TO REDUCE THE EFFECT OF CORRELATED PERTURBATIONS

(75) Inventors: Ahmed Mohamed Abdelatty Ali, Oak Ridge, NC (US); Huseyin Dinc, Greensboro, NC (US); Paritosh Bhoraskar, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 29 days.

(21) Appl. No.: 13/159,679

(22) Filed: Jun. 14, 2011

(65) Prior Publication Data

US 2012/0319879 A1    Dec. 20, 2012

(51) Int. Cl.
*H03M 1/06* (2006.01)
(52) U.S. Cl. .................................. 341/118; 341/161
(58) Field of Classification Search .................. 341/155, 341/118, 120, 161; 330/9
See application file for complete search history.

(56) References Cited

U.S. PATENT DOCUMENTS

| | | | |
|---|---|---|---|
| 5,847,600 A * | 12/1998 | Brooks et al. ..................... | 330/9 |
| 6,756,929 B1 | 6/2004 | Ali | |
| 6,839,009 B1 | 1/2005 | Ali | |
| 7,271,750 B1 | 9/2007 | Ali | |
| 7,902,922 B2 | 3/2011 | Suzuki et al. | |
| 2002/0047790 A1 | 4/2002 | Ali | |
| 2010/0014685 A1 | 1/2010 | Wurm | |
| 2010/0039302 A1 | 2/2010 | Ali et al. | |
| 2012/0212358 A1 * | 8/2012 | Shi et al. ....................... | 341/118 |
| 2012/0274492 A1 * | 11/2012 | Ali et al. ....................... | 341/120 |

OTHER PUBLICATIONS

PCT International Search Report and Written Opinion PCT/US12/37995 mailed on Aug. 17, 2012.

* cited by examiner

*Primary Examiner* — Peguy Jean Pierre
(74) *Attorney, Agent, or Firm* — Kenyon & Kenyon LLP

(57) ABSTRACT

A process allows for the modification of the least-means-square (LMS) algorithm to remove perturbations associated with measured signals in an analog-to-digital converter (ADC). The process includes measuring the perturbations and determining a coefficient associated with the perturbations. The LMS algorithm is modified in accordance with whether a digital or an analog correction of the inter-stage error of a residue amplifier on the ADC is to be made.

16 Claims, 4 Drawing Sheets

METHOD FOR MODIFYING THE LMS ALGORITHM TO REDUCE THE EFFECT OF CORRELATED PERTURBATIONS

FIELD OF THE INVENTION

The present invention relates to a method for modifying a least-means-square algorithm. The present invention further relates to a process for removing perturbations correlated with signals for the least-means-square algorithm.

BACKGROUND INFORMATION

The following patent is hereby incorporated by reference herein: U.S. Pat. No. 7,271,750 ("the '750 patent"), issued Sep. 18, 2007.

Pipelined analog-to-digital converters ("ADCs") that are used for sampling often require specific signal-to-noise ratios or high sampling rates. These converters contain a plurality of stages, each of the stages having a multiplying DAC ("MDAC") and a flash ADC, with the first few stages requiring large sampling capacitors and a large amplifier within the MDAC. FIG. 1 illustrates such an amplifier in one stage of the ADC. Amplifier 1 contains two stages, a cascode amplifier as the first stage, and a differential pair as the second stage. Amplifier 1 needs a high gain and a high bandwidth for proper operation of the MDAC. However, a high gain and a high bandwidth necessitate a high power consumption which is not desirable for the converter. Reducing the power consumption of the converter may be undertaken by relaxing the gain and bandwidth requirements of the amplifier within the MDAC. However, relaxing gain and bandwidth requirements creates inter-stage errors that are temperature and sample rate dependent.

The summing-node-sampling ("SNS") calibration algorithm, discussed in the '750 patent, is an algorithm that allows for simultaneously lowering the open-loop gain and the bandwidth of the amplifier within the MDAC. This allows for the power consumption of the ADC to be lowered and the inter-stage gain errors can be corrected by the SNS algorithm. The SNS algorithm samples the voltage at the summing-node of the MDAC ("summing-node voltage") and processes the samples at a sample rate that is lower than the sample rate of the converter, which significantly decreases the power consumption of the calibration engine. The summing-node voltage is amplified by a predetermined gain and then digitized using a separate analog-to-digital converter. The open-loop gain of residue amplifier 1 can be estimated from the output of the MDAC ("residue voltage") and the summing-node voltage, and therefore the SNS algorithm assists in determining the amplifier's open-loop gain.

The digitized summing-node voltage and a separately digitized residue voltage are first high pass filtered to remove offset and then processed using a least-mean-square ("lMS") algorithm to filter out noise and estimate the amplifier's open-loop gain. The LMS algorithm is used by the SNS algorithm and can correct the inter-stage gain error through a digital correction or through an analog correction.

Digitally correcting the inter-stage error can be done by using the LMS algorithm to iteratively estimate the value of the inverse of the gain $\alpha$ (where $\alpha=1/A$, A being the open-loop gain of the amplifier). The estimate of $\alpha$ is done to find the value of $\alpha$ that minimizes the error, as shown in equation (i).

$$\varepsilon = \left[\alpha D(V_{o1}) - D\left(\frac{V_{o1}}{A}\right)\right]^2, \qquad \text{(i)}$$

where $\varepsilon$ is the algorithm estimation error squared, $D(x)$ is the digital value of x, and $V_{o1}$ is the residue voltage of the first stage.

Equation (ii) may illustrate estimating an inverse of the open-loop gain of the amplifier iteratively, where:

$$\alpha_{i+1} = \alpha_i - \mu D(V_{o1i})\left[\alpha_i D(V_{o1i}) - D\left(\frac{V_{o1i}}{A}\right)\right], \qquad \text{(ii)}$$

where $\alpha_i$ is the $i^{th}$ iteration of $\alpha$ and $\mu$ is the algorithm step size.

$$\left(\frac{V_{o1i}}{A}\right),$$

If $V_{e1}$ represents the summing-node voltage of the first stage of the ADC equation (ii) may be further shown by equation (iii):

$$\alpha_{i+1} = \alpha_i - \mu D(V_{o1i})[\alpha_i D(V_{o1i}) - D(V_{e1})] \qquad \text{(iii).}$$

An iterative determination of the inverse of the gain $\alpha$ which minimizes the error, allows for the digital correction of the gain error by multiplying the residue voltage by a correction factor. This may be represented by equation (iv):

$$V_{o1_{cor}} = V_{o1}(1 + K\alpha) \qquad \text{(iv),}$$

where $V_{o1_{cor}}$ is the calibrated residue voltage of the first stage of the pipeline, and K is a correction factor that is the inverse of the feedback factor.

The LMS algorithm can also correct the inter-stage error through an analog correction. The analog correction can be done by using the LMS algorithm to maximize the open-loop gain of the amplifier A, by using a bias voltage gain ($V_{gain}$) derived in a positive-feedback circuit connected to the amplifier. $V_{gain}$ is depicted in FIG. 1. A maximum value of an open-loop gain can thus be enabled regardless of changes in temperature, supply, and process. A positive-feedback circuit 2 can be connected across the internal nodes of the amplifier 1. FIG. 2 further illustrates the positive-feedback circuit 2 connected to the internal nodes of residue amplifier 1. The feedback circuit 2 creates a negative transconductance circuit in parallel with the output impedance of the first stage of the amplifier. This negative transconductance reduces the output conductance of the first stage of the amplifier shown in FIG. 1, thereby increasing the open-loop gain. This can be done by matching output impedance of the first stage of the amplifier with an opposite negative trans-impedance of the positive feedback circuit 2. Matching can be achieved by varying $V_{gain}$ shown in FIGS. 1 and 2. Rather than providing an estimate for the inverse of the gain of $\alpha$ as done through digital correction, through analog correction, the LMS algorithm can minimize the estimate of a by controlling $V_{gain}$. This is illustrated in equation (v):

$$V_{gain_{i+1}} = V_{gain_i} - \mu D(V_{o1i}) D\left(\frac{V_{o1i}}{A}\right), \qquad \text{(v)}$$

where $V_{gain_i}$ is $i^{th}$ iteration of the bias voltage gain from the feedback circuit.

$$\left(\frac{V_{o1i}}{A}\right),$$

As $V_{e1}$ represents the summing-node voltage of the first stage of the pipeline equation (v) may be rewritten by equation (vi):

$$V_{gain_{i+1}} = V_{gain_i} - \mu D(V_{o1i}) D(V_{e1})$$ (vi).

Although the LMS algorithm attempts to filter noise and perturbations from the digitized summing-node voltage and the residue voltage, the algorithm as discussed in the '750 patent is insufficient to filter perturbations correlated with these signals whether digital or analog correction is undertaken. A measurement of the summing-node voltage may be affected by the input signal due to coupling, as sampling occurs continuously and all of the samples are used by the algorithm. Noise and perturbations accompany the sampled summing-node voltage and the residue signals, and can be correlated with the summing-node voltage and the residue voltage. Therefore, the noise and perturbations may not be not sufficiently filtered by the LMS algorithm. These perturbations can greatly alter a convergence or an estimation of the open-loop gain (or inverse of the gain) or if the error is corrected through analog calibration, the convergence of the bias voltage.

Thus there remains a need in the art, for a modified algorithm which may allow for the removal of unwanted perturbations and noise associated with the summing-node voltage and the residue voltage signals.

DETAILED DESCRIPTION

The subject invention will now be described in detail for specific preferred embodiments of the invention, it being understood that these embodiments are intended only as illustrative examples and the invention is not to be limited thereto.

Perturbations accompanying measured signals that affect the LMS algorithm and their adverse effects in determination of the gain estimate may be removed by developing a modified algorithm to filter out the perturbations. Embodiments of the present invention provide for an analog-to-digital converter, an auxiliary ADC, and a unit that houses a modified LMS algorithm. The ADC may be a pipelined ADC containing multiple stages, where each stage may contain a multiplying DAC and a flash ADC. Embodiments of the present invention further provide for a process that allows for the modification of the LMS algorithm to remove perturbations associated with measured signals in the ADC. Perturbations in the ADC may be measured and a coefficient associated with the perturbations may be determined. The LMS algorithm may be modified in accordance with a correction of the inter-stage error of the ADC.

Figure 1:
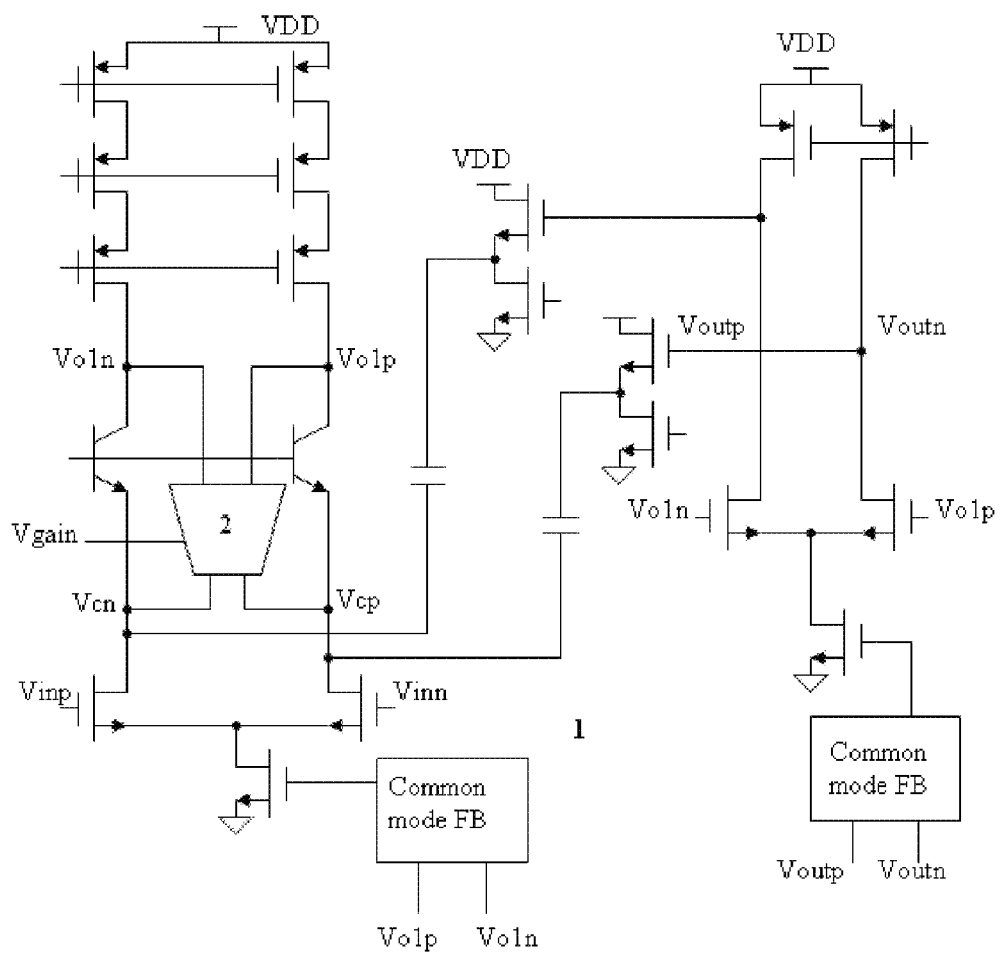
FIG. 1 is a schematic of the amplifier in the MDAC in one of the stages of the ADC.
Figure 2:
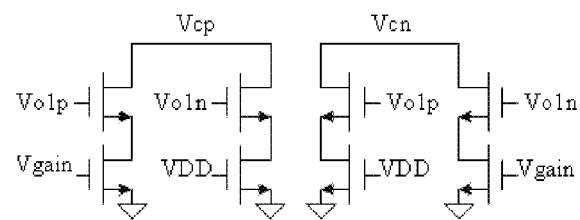
FIG. 2 is a schematic of a positive-feedback circuit used to increase the open-loop gain of the amplifier in the MDAC in one of the stages of the ADC.
Figure 3:
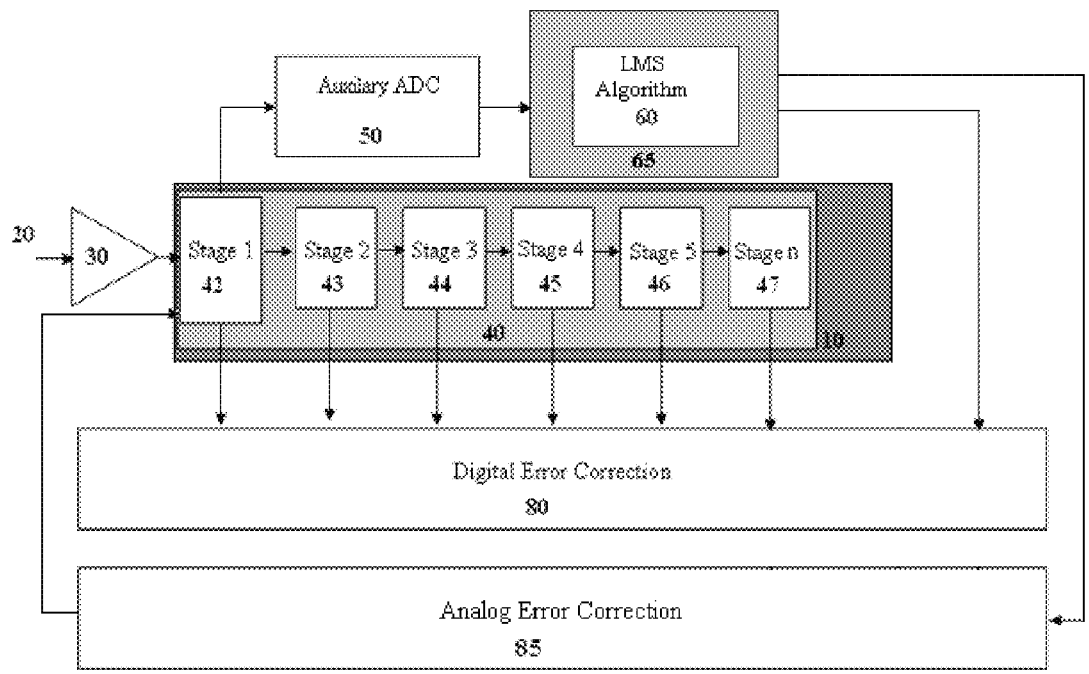
FIG. 3 is a block diagram of a pipelined ADC corrected through a digital or an analog correction by the LMS algorithm of the present invention.

FIG. 3 illustrates a diagram of a pipelined analog-to-digital converter of the present invention. In an embodiment, ADC 10 may be a 16-bit converter and may not use a sample and hold amplifier ("SHA"). ADC 10 may contain a pipeline 40 with a number of stages 42-47 of varying bit size. In an embodiment, the first stage 42 may be 3 bits, the second stage 43 may be 3 bits, and stages 44-47 may each be 3 bits. Input signal 20 may be applied to the input of ADC 10, which may be stored on a sample and hold circuit in the first stage 42 of pipeline 40, since ADC 10 may not use an SHA.

Input buffer 30 may be used to improve distortion and reduce kickback from the sampling capacitors in the sample and hold circuit in the first stage 42. Input buffer 30 may be an emitter-follower circuit. Input signal 20 may be applied to the input terminal of input buffer 30. Input buffer 30 may output a signal to drive ADC 10, by outputting a signal to the first stage 42 of pipeline 40, which is sampled on the sampling capacitors in the first stage. Each of the stages of pipeline 40 may be connected to digital error correction unit 80 which may correct errors due to the flash ADC 70 errors in each stage, but may not correct inter-stage-gain errors due to the multiplying DAC 90 of each stage.

Figure 4:
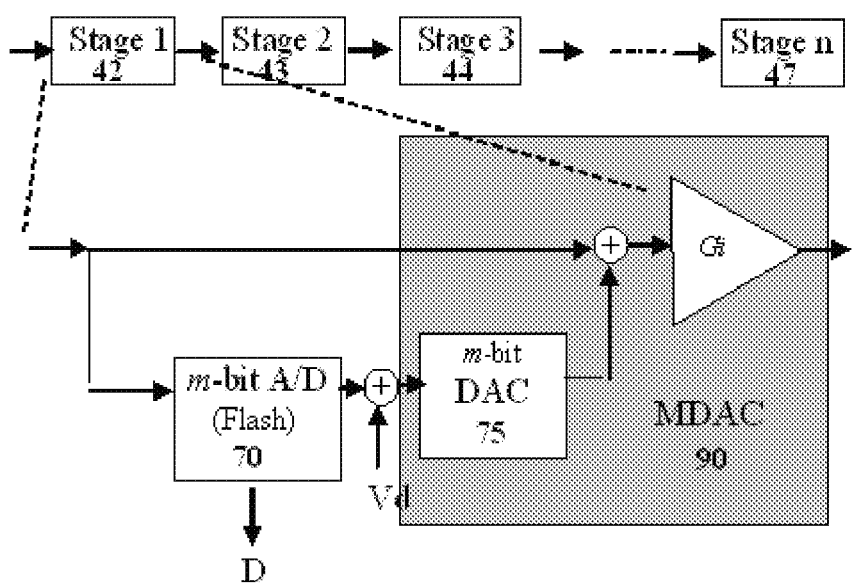
FIG. 4 is a diagram of an individual stage of the pipelined ADC of the present invention.

Each of the stages of pipeline 40 may have an amplifier 1 that drives the stage of the pipeline. FIG. 4 further illustrates an individual stage of pipeline 40. Each of the stages 42-47 may include a flash ADC 70 and a multiplying DAC ("MDAC") 90. The MDAC 90 may include DAC 75 and a corresponding summation and gain block, as illustrated in FIG. 4. Each of the stages of 42-47 may have an amplifier 1 housed in the MDAC 90 that drives the stage. Flash ADC 70 and DAC 75 in MDAC 90 may be the same bit size. In an embodiment, flash ADC 70 and DAC 75 of the first stage 42 may be 3 bits. The flash ADCs and MDACs of stages 43-47 may be the same bit size or a different bit size from the flash ADC 70 and MDAC 90 in the first stage.

The first stage 42 of pipeline 40 may be connected to auxiliary ADC 50 and to a unit executing the SNS algorithm 65. Auxiliary ADC 50 may have a bit size lower than ADC 10 and may operate at a slower clock rate than ADC 10. Auxiliary ADC 50 may digitize the received summing-node voltage.

The SNS algorithm may also include LMS algorithm 60. SNS algorithm unit 65 and LMS algorithm 60 may be connected to digital error correction unit 80 which allows for a digital correction of the inter-stage gain errors. SNS algorithm unit 65 and LMS algorithm 60 may also be connected to analog error correction unit 85 which may correct for the inter-stage gain error by calibrating the bias voltage $V_{gain}$ which is fed back to the amplifier in the first stage 42 (or any other stage that is being calibrated).

The estimate obtained using SNS algorithm unit 65 can be used by an external arrangement (not pictured) to measure the undesirable signal associated with the summing-node voltage. In an embodiment where there is more than one perturbed signal, all of the corresponding undesirable signals may be measured and determined. From the measurement of the undesirable signal, a voltage corresponding to the undesirable signal may be determined. A perturbation factor may also be determined from the measurement of the undesirable signal.

To remove the effect of the perturbations on the estimation or calibration, the undesirable signal may be canceled out of the LMS algorithm. The LMS algorithm may be modified to correct for the presence of the undesirable signal. The LMS algorithm may vary depending on whether the inter-stage error is digitally corrected through digital correction unit 80 or corrected through analog means through analog correction unit 85. A coefficient γ may be determined by SNS algorithm unit 65 to match a determined perturbation factor. This coefficient may be the same for both the digital correction and the analog correction of the inter-stage error.

If the inter-stage errors are to be digitally corrected, the LMS algorithm may be modified to iteratively estimate the value of the inverse of the gain, α, without the presence of the undesirable signal. Equation (vii) may represent a modified LMS algorithm for a digital correction of the inter-stage error:

$$\alpha_{i+1} = \alpha_i - \mu D(V_{o1i})\left[\alpha_i D(V_{o1i}) - D\left(\frac{V_{o1i}}{A}\right) - \gamma D(V_{un})\right], \quad \text{(vii)}$$

where $\alpha_i$ is the $i^{th}$ iteration of the inverse of the game, μ is the algorithm step size, $V_{o1}$ is the residue voltage of the first stage, γ is the perturbing coefficient, and $V_{un}$ is the voltage of the undesirable signal. The coefficient γ may be proportional to the correlation between the desired signal and the undesired coupling signal.

$$\left(\frac{V_{o1i}}{A}\right),$$

If $V_{e1}$ represents the summing-node voltage of the first stage of the pipeline equation (vii) may be further simplified by the modified algorithm in equation (viii):

$$\alpha_{i+1} = \alpha_i - \mu D(V_{o1i})[\alpha_i D(V_{o1i}) - D(V_{e1}) - \gamma D(V_{un})] \quad \text{(viii)}.$$

The LMS algorithm may also be modified specifically for an analog correction using a modified algorithm to maximize the open-loop gain of the amplifier, by calibrating a bias voltage $V_{gain}$ generated in a connected feedback circuit 2. The modified LMS algorithm may minimize the estimate of α, thus maximizing the open-loop gain of the amplifier, by controlling $V_{gain}$ without interference from an undesired signal. This LMS algorithm for an analog correction is illustrated in equation (ix):

$$V_{gain_{i+1}} = V_{gain_i} - \mu D(V_{o1i})\left[D\left(\frac{V_{o1i}}{A}\right) - \gamma D(V_{un})\right], \quad \text{(ix)}$$

where $V_{gain_i}$ is $i^{th}$ iteration of the bias voltage gain from the feedback circuit.

$$\left(\frac{V_{o1i}}{A}\right),$$

As $V_{e1}$ represents the summing-node voltage of the first stage of the pipeline the modified LMS algorithm for an analog correction can be simplified to equation (x).

$$V_{gain_{i+1}} = V_{gain_i} - \mu D(V_{o1i})[D(V_{e1}) - \gamma D(V_{un})] \quad \text{(x)}.$$

Figure 5:
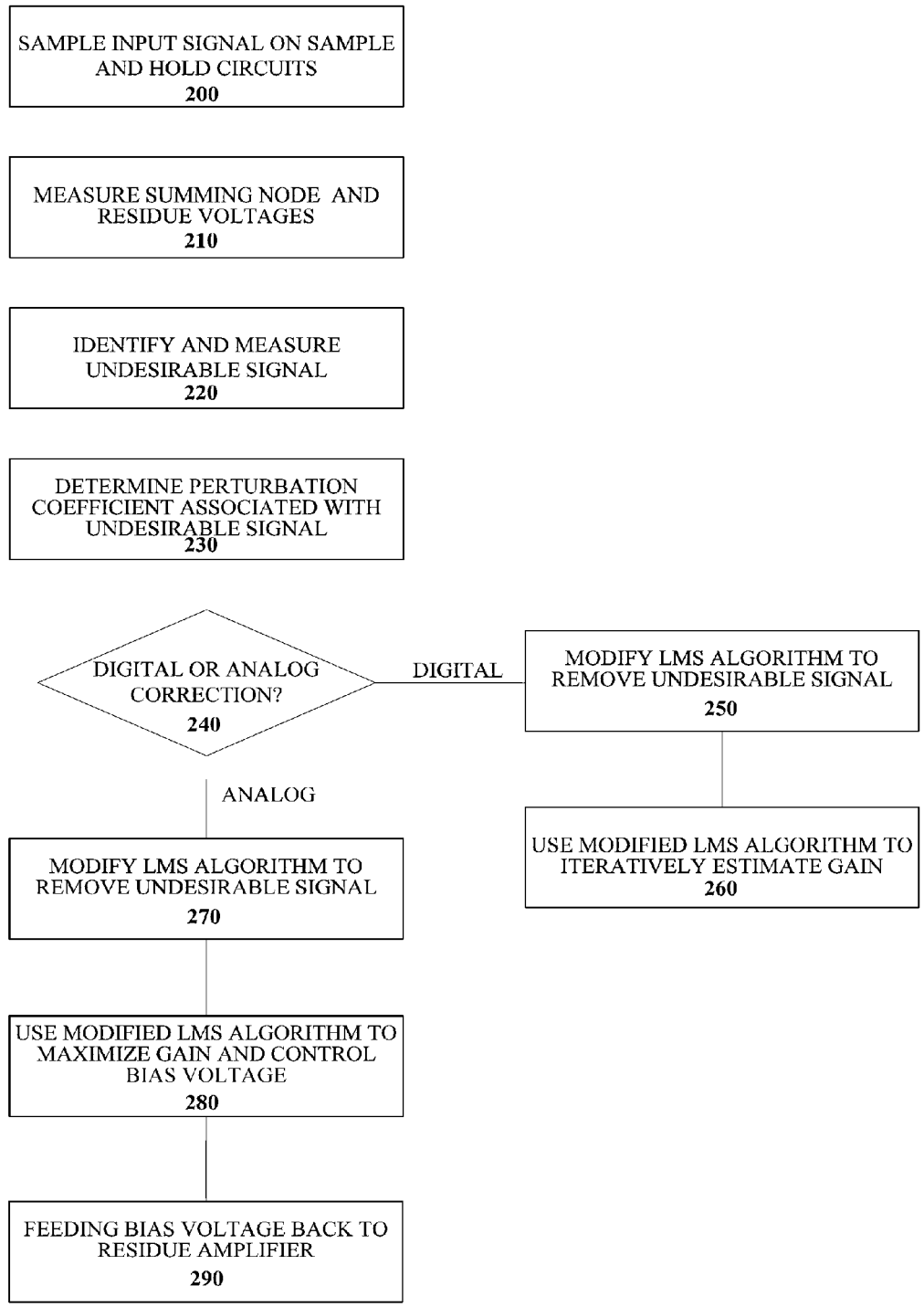
FIG. 5 is a diagram of the process of the modification of the LMS algorithm of the present invention.

FIG. 5. illustrates the process of the modification of the LMS algorithm during operation of ADC 10. During operation, an input signal 20 may be applied to ADC 10. In step 200, input signal 20 may be sampled and stored on sample-and-hold circuits on the MDAC 90. The capacitors in the sample-and-hold circuit in MDAC 90 may sum at the inverting input of the residue amplifier, which may represent the summing-node voltage. The residue amplifier may also output a residue voltage. In step 210, the summing-node voltage and the residue voltage may be measured using the auxiliary and main pipelines ADCs respectively and used by the SNS algorithm unit 65 to estimate the gain error. In step 220, any undesirable signals associated with the summing-node voltage or the residue voltage may be identified and measured. In step 230, a digital block or algorithm (not pictured) may determine a perturbation coefficient associated with the undesirable signal.

In step 240, a decision may be made as to whether a digital or analog correction of the inter-stage error is to be made. If a digital correction of the inter-stage error is to be made, in step 250 the LMS algorithm for a digital correction may be modified to cancel out the presence of the undesirable signal. In step 260, the modified LMS algorithm may be used to iteratively estimate the open-loop gain (or the inverse of the gain, a).

If in step 240, the decision is made to make an analog correction, the system may move to step 270. In step 270, the LMS algorithm for analog calibration may be modified to minimize the presence of the undesired signal. In step 280, the modified LMS algorithm may be used to calibrate the bias voltage $V_{gain}$ to maximize the open-loop gain. In step 290, the bias voltage may be fed back to the residue amplifier.

Although FIGS. 3-5 illustrate the modification of the LMS algorithm to remove a single undesired signal, it should be understood that the discussed method may be applied to embodiment in which there are more than one undesirable signal. In addition, the above method may be applied to remove correlated perturbations for any of the subsequent stages 43-47 of the ADC, and not just the first stage.

Several embodiments of the invention are specifically illustrated and/or described herein. However, it will be appreciated that modifications and variations of the invention are covered by the above teachings and within the purview of the appended claims without departing from the spirit and intended scope of the invention.

What is claimed is:

1. A method for modifying a least-mean-square (LMS) algorithm to reduce an effect of perturbations on a correction of an inter-stage error of a residue amplifier, the method comprising:
    sampling an input signal on a multiplying digital-to-analog converter (MDAC) housed in a stage of an analog-to-digital converter (ADC);
    measuring a summing-node voltage and a residue voltage by the ADC and an auxiliary analog-to-digital converter (ADC);
    identifying at least one undesirable signal correlated with the summing-node voltage or the residue voltage, wherein a voltage of the at least one undesirable signal is determined;
    modifying the LMS algorithm to cancel out the undesirable signal; and
    iteratively calculating a gain estimate with the modified LMS algorithm.

2. The method according to claim 1, further comprising:
    determining a perturbation coefficient of the at least one undesirable signal.

3. The method according to claim 1, further comprising:
    determining whether a digital or analog correction of the inter-stage error is to be made.

4. The method according to claim 1, wherein the residue amplifier is housed in the MDAC and drives the MDAC.

5. The method according to claim 1, wherein the residue voltage is an output of the residue amplifier.

6. The method according to claim 1, wherein the input signal is sampled on a sample and hold circuit on the MDAC.

7. The method according to claim 1, wherein the summing-node voltage is output to the auxiliary ADC for digitization.

8. A method for modifying a least-mean-square (LMS) algorithm to reduce an effect of perturbations on a correction of an inter-stage error of a residue amplifier, the method comprising:
    sampling an input signal on a multiplying digital-to-analog converter (MDAC) housed in a stage of an analog-to-digital converter (ADC);
    measuring a summing-node voltage and a residue voltage by the ADC and an auxiliary analog-to-digital converter (ADC);
    identifying at least one undesirable signal correlated with the summing-node voltage or the residue voltage, wherein a voltage of the at least one undesirable signal is determined;
    modifying the LMS algorithm to cancel out the undesirable signal;
    calibrating a bias voltage with the modified LMS algorithm to maximize a gain; and
    feeding back the bias voltage to the residue amplifier.

9. The method according to claim 8, further comprising:
    determining a perturbation coefficient of the at least one undesirable signal.

10. The method according to claim 8, further comprising:
    determining whether a digital or analog correction of the inter-stage error is to be made.

11. The method according to claim 8, wherein the residue amplifier is housed in the MDAC and drives the MDAC.

12. The method according to claim 8, wherein the residue voltage is an output of the residue amplifier.

13. The method according to claim 8, wherein the input signal is sampled on a sample and hold circuit on the MDAC.

14. The method according to claim 8, wherein the summing-node voltage is output to the auxiliary ADC for digitization.

15. A system for modifying a least-mean-square (LMS) algorithm to reduce an effect of perturbations on a correction of an inter-stage error of a residue amplifier, the system comprising:
    an analog-to-digital converter (ADC) having a plurality of stages;
    a multiplying digital-to-analog converter (MDAC) situated in the ADC, wherein a summing-node voltage and a residue voltage is measured on the MDAC;
    an auxiliary analog-to-digital converter (ADC) for digitizing the summing-node voltage;
    a first arrangement that executes the LMS algorithm, the second arrangement identifying at least one undesirable signal correlated with the summing-node voltage or the residue voltage;
    a second arrangement for modifying the LMS algorithm to cancel out the undesirable signal; and
    a digital error correction unit that iteratively calculates a gain estimate with the modified LMS algorithm.

16. A system for modifying a least-mean-square (LMS) algorithm to reduce an effect of perturbations on a correction of an inter-stage error of a residue amplifier, the system comprising:
    an analog-to-digital converter (ADC) having a plurality of stages;
    a multiplying digital-to-analog converter (MDAC) situated in the ADC, wherein a summing-node voltage and a residue voltage is measured on the MDAC;
    an auxiliary analog-to-digital converter (ADC) for digitizing the summing-node voltage;
    a first arrangement that executes the LMS algorithm, the second arrangement identifying at least one undesirable signal correlated with the summing-node voltage or the residue voltage;
    a second arrangement for modifying the LMS algorithm to cancel out the undesirable signal; and
    an analog error correction unit that calibrates a bias voltage with the modified LMS algorithm to maximize a gain and feeds back the bias voltage to the residue amplifier.

* * * * *